United States Patent
Hoffmann et al.

(10) Patent No.: US 9,090,854 B2
(45) Date of Patent: Jul. 28, 2015

(54) METHOD AND APPARATUS FOR PROCESSING WAFER-SHAPED ARTICLES

(75) Inventors: Stephan Hoffmann, Finkenstein (DE); Harald Kraus, Villach (AT); Gunter Mettin, Villach (AT)

(73) Assignee: LAM RESEARCH AG, Villach (AT)

( * ) Notice: Subject to any disclaimer, the term of this patent is extended or adjusted under 35 U.S.C. 154(b) by 893 days.

(21) Appl. No.: 13/281,014

(22) Filed: Oct. 25, 2011

(65) Prior Publication Data
US 2013/0098392 A1   Apr. 25, 2013

(51) Int. Cl.
| | |
|---|---|
| C23G 1/00 | (2006.01) |
| C11D 7/06 | (2006.01) |
| C23G 3/00 | (2006.01) |
| H01L 21/02 | (2006.01) |
| H01L 21/67 | (2006.01) |
| C11D 11/00 | (2006.01) |
| C23G 1/14 | (2006.01) |
| C11D 7/32 | (2006.01) |

(52) U.S. Cl.
CPC ............... *C11D 7/06* (2013.01); *C11D 7/3209* (2013.01); *C11D 11/0047* (2013.01); *C23G 1/14* (2013.01); *C23G 3/00* (2013.01); *H01L 21/02057* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 5,977,542 A | 11/1999 | Singh et al. | |
| 6,431,185 B1 | 8/2002 | Tomita et al. | |
| 6,613,499 B2 | 9/2003 | Chang | |
| 6,741,445 B1 | 5/2004 | Phan et al. | |
| 7,449,127 B2 | 11/2008 | Verhaverbeke et al. | |
| 7,799,200 B1 | 9/2010 | Mayer et al. | |
| 2002/0093648 A1 | 7/2002 | Nikoonahad et al. | |
| 2006/0115774 A1 | 6/2006 | Wang et al. | |
| 2010/0236579 A1 | 9/2010 | Araki et al. | |

OTHER PUBLICATIONS

Venkatesh et al., "Electrochemical Impedance Spectroscopy (EIS) Analysis of BTA Removal by TMAH during Post Cu CMP Cleaning Process", ECS Transactions, 2011, vol. 41, No. 5, pp. 323-330.
International Search Report, dated Feb. 20, 2013, from corresponding PCT application.

*Primary Examiner* — Eric Golightly
(74) *Attorney, Agent, or Firm* — Young & Thompson

(57) ABSTRACT

In a method and apparatus for treating a surface of an article, an improved rinse liquid prevents build-up of static charge while avoiding damages to certain types of exposed metal-containing surfaces. In one embodiment, a semiconductor wafer having structures including at least one of cobalt, nickel and platinum is rotated on a spin chuck, as a rinse liquid is dispensed onto a surface of the wafer. The rinse liquid is a dilute aqueous solution of a base of the formula

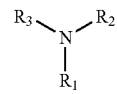

in which $R_1$, $R_2$ and $R_3$ are each independently selected from hydrogen and $C_{1-4}$ alkyl. The base has a boiling point less than 100° C., and the rinse liquid has a pH in the range of 8 to 10.

10 Claims, 2 Drawing Sheets

METHOD AND APPARATUS FOR PROCESSING WAFER-SHAPED ARTICLES

BACKGROUND OF THE INVENTION

1. Field of the Invention

The invention relates to methods and apparatus for treating surfaces of articles, such as semiconductor wafers.

2. Description of Related Art

Semiconductor wafers undergo a variety of wet processing stages during manufacture of integrated circuits. Typically, the wafers must be rinsed and dried after a wet processing stage utilizing a given chemical composition, before commencing a succeeding wet processing stage utilizing a different chemical composition.

However, the rinsing process must be controlled so as not to cause damage to the submicroscopic structures that are formed on the wafer surface. For example, if the surface tension of the rinse liquid is too high, then the radially outward movement of the liquid across the spinning wafer surface can lead to pattern collapse and a resulting decrease in the yield of the processed wafers.

It has also been recognized that when deionized water is used as a rinse liquid, the insulative characteristics of the deionized water can lead to the accumulation of static charges on the wafer surface. When the static charge accumulates beyond a given threshold, it is discharged by arcing, which can also damage the structures formed on the wafer surface and consequently reduce wafer yield. A conventional response to this problem has been to include dissolved carbon dioxide in the deionized water, which renders the deionized water conductive and prevents accumulation of static charges on the wafer surface.

These problems tend to become more severe as wafer diameters increase and as the size of the device features formed on the wafers continue to decrease.

SUMMARY OF THE INVENTION

The method and apparatus of the present invention is based in part on the inventors' discovery that conventional deionized water-carbon dioxide solutions cause undesirable material removal when used on wafers having structures that include certain metals or metal-containing materials. The present inventors have further discovered that dilute aqueous solutions of low-boiling weak bases can provide the desired conductivity to a deionized water rinse solution without causing disadvantageous removal of such metals or metal-containing materials during rinsing.

Thus, the present invention in one aspect relates to a method for treating a surface of an article, comprising rotating an article on a spin chuck about a rotation axis. The article comprises a surface generally perpendicular to the rotation axis that comprises structures including a material that comprises at least one metal selected from the group consisting of cobalt, nickel, copper and platinum. A rinse liquid is dispensed onto the surface. The rinse liquid comprises an aqueous solution of a base of the formula

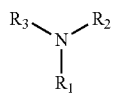

in which $R_1$, $R_2$ and $R_3$ are each independently selected from hydrogen and $C_{1-4}$ alkyl. The base furthermore has a boiling point less than 100° C., and the rinse liquid has a pH in the range of 8 to 10.

In preferred embodiments of the method according to the present invention, the article is a semiconductor wafer.

In preferred embodiments of the method according to the present invention, the material is a silicide of the at least one metal.

In preferred embodiments of the method according to the present invention, the base is a gas at 25° C. and 101.325 kPa.

In preferred embodiments of the method according to the present invention, the base is $NH_3$.

In preferred embodiments of the method according to the present invention, the $NH_3$ is present in the rinse liquid at a concentration from $10^{-5}$ mol/L to $10^{-4}$ mol/L.

In preferred embodiments of the method according to the present invention, the material is a cobalt silicide layer formed on at least one terminal of transistors formed on the surface.

In preferred embodiments of the method according to the present invention, the article is rotated at a speed of 10-2000 rpm, preferably 100-1500 rpm, and more preferably 500-1000 rpm.

In preferred embodiments of the method according to the present invention, the surface of the article faces away from the spin chuck.

The present invention in another aspect relates to an apparatus for treating a surface of an article, comprising a spin chuck adapted to rotate an article about a rotation axis, with a surface of the article being oriented generally perpendicular to the rotation axis. The apparatus also includes a dispenser positioned so as to dispense rinse liquid onto the surface of the article, and a supply of rinse liquid. The rinse liquid comprises an aqueous solution of a base of the formula

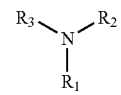

in which $R_1$, $R_2$ and $R_3$ are each independently selected from hydrogen and $C_{1-4}$ alkyl, the base having a boiling point less than 100° C., and the rinse liquid having a pH in the range of 8 to 10.

In preferred embodiments of the apparatus according to the present invention, the spin chuck is incorporated in a process module for single wafer wet processing of semiconductor wafers.

In preferred embodiments of the apparatus according to the present invention, the supply of rinse liquid is fed from an upstream mixer that receives feeds of deionized water and a more concentrated aqueous solution of the base. The mixer combines the deionized water and the concentrated aqueous solution of the base to produce the rinse liquid.

In preferred embodiments of the apparatus according to the present invention, the base is $NH_3$, and the rinse liquid has a concentration of $NH_3$ from $10^{-5}$ mol/L to $10^{-4}$ mol/L.

In preferred embodiments of the apparatus according to the present invention, the apparatus further comprises a sensor positioned adjacent the surface of the article to detect a static charge level, and a microcontroller that varies proportions of the deionized water and concentrated aqueous solution in response to a readout of the sensor.

The methods and apparatus of the invention are not limited to use on semiconductor wafers, and have application as well for treating surfaces of other materials, for example glass masters and mother panels used in manufacturing optical disks and LCD display panels, as well as for cleaning surfaces of processing chambers used during processing of the above-described substrates.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

In the manufacture of semiconductor devices, the terminals of a transistor, i.e., the source and drain regions and the gate electrode, are commonly provided with an upper layer of a metal silicide, whose purpose is to reduce contact resistance at those terminals and thus to increase device operation speed. In recent years, cobalt, nickel, platinum, and alloys of these metals have been identified as forming silicides having particularly low contact resistance in these structures.

Similarly, damascene copper has largely replaced aluminum wiring for interconnects in semiconductor devices, in view of the lower resistance of copper wiring relative to aluminum. Electrolessly deposited films of cobalt tungsten phosphide (CoWP) are used as copper capping layers to prevent electromigration of copper in advanced back end of the line (BEOL) processes.

Figure 1:
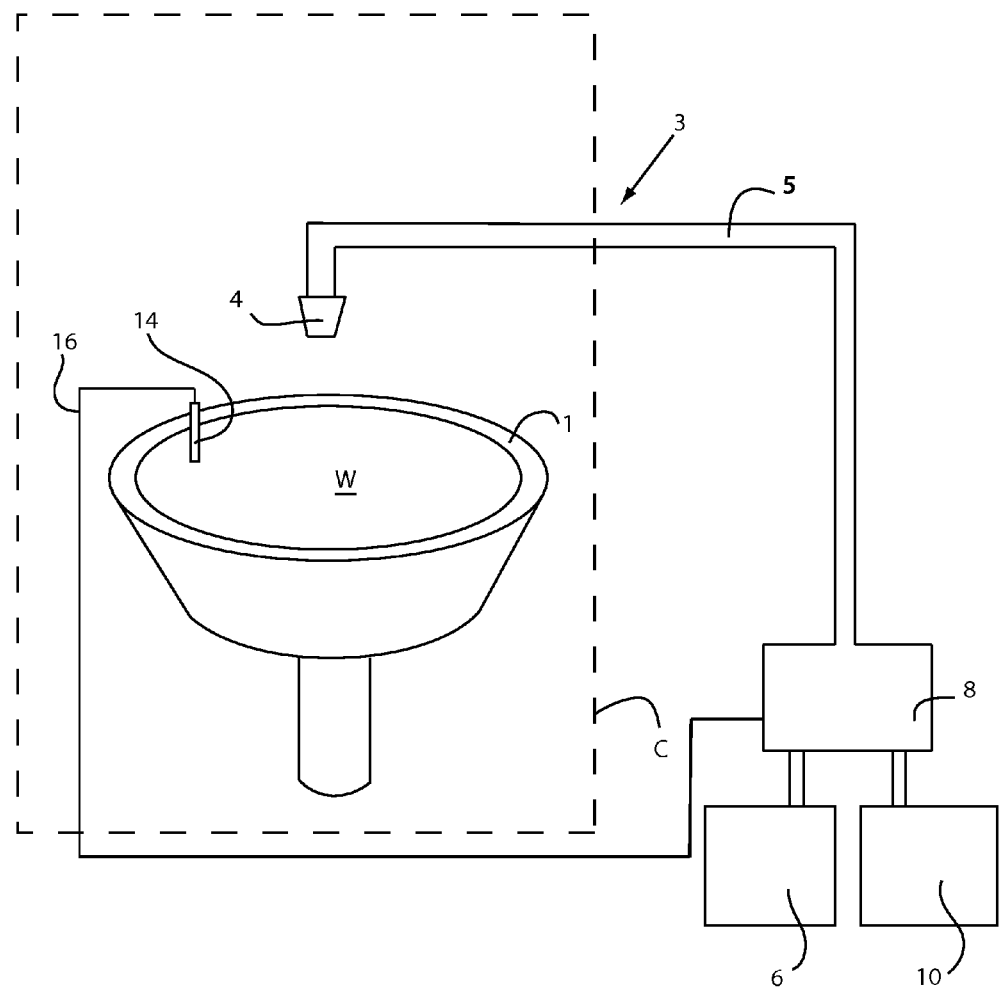
FIG. 1 is a schematic representation of an apparatus for treating surfaces of semiconductor wafers according to an embodiment of the invention.

In FIG. 1, a 300 mm diameter semiconductor wafer W is held by a spin chuck 1, in a surrounding processing chamber C for single wafer wet processing. In this embodiment, a dispenser 3 of rinse liquid comprises a dispense arm 5 with a dispense nozzle 4 configured to dispense the treatment liquid onto the wafer in a free flow. The nozzle orifice has a cross-sectional area in the range of 3 to 300 mm$^2$, and preferably 10 to 100 mm$^2$.

It will be appreciated that the apparatus depicted in FIG. 1 could be adapted to hold wafers of any desired diameter, such as 200 mm and 450 mm.

The rinse liquid is created by combining deionized water (DI) from a DI supply 6, with a concentrated aqueous solution of a base, from base solution supply 10. The DI and concentrated base solution are mixed in mixer 8. Mixer 8 is adapted to vary the proportions of the DI and base solution, so as to achieve a desired final concentration of the base in the rinse liquid, and so as to maintain a desired pH of the rinse liquid.

In the depicted embodiment, an electrostatic charge sensor 14 is positioned adjacent the wafer W, and its readout is supplied via signal line 16 to the mixer 8, which in turn adjusts the proportions of the components to be mixed. For example, if the sensor 14 detects a level of electrostatic charge in excess of a predetermined threshold, then mixer 8 will increase the concentration of the base in the final rinse liquid so as more effectively to dissipate the accumulating static charge.

It will be appreciated that, although the readout of sensor 14 is depicted schematically as being fed to mixer 8, in practice the readout will typically be sent to a computer that controls the overall operations of the process module in which the spin chuck 1 is mounted, and that the computer will in turn control the mixer 8 on the basis of that readout.

The base used in the rinse liquid according to the invention is ammonia or a lower alkyl amine, and can be represented by the formula:

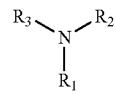

in which $R_1$, $R_2$ and $R_3$ are each independently selected from hydrogen and $C_{1-4}$ alkyl. The base is limited to those compounds of the above formula having a boiling point less than 100° C. Preferably, the base is a gas at 25° C. and 101.325 kPa.

Ammonia is the most preferred base for use in the method and apparatus of the present invention, because its low boiling point helps to ensure that no residue remains on the wafer surface as the ammonia water is spun off of the wafer.

In this case, supply 10 contains a more concentrated ammonia solution, for example a 1M ammonia solution (whose pH is therefore about 11.6). As ammonia is a relatively weak base, it is not fully protonated in aqueous solution, but rather both $NH_3$ and $NH_4^+$ species will coexist as a function of the total ammonia content and the $pK_B$ of ammonia.

Although ammonia is the preferred base for use in the rinse liquid of the present invention, a number of the lower alkyl amines also possess suitable properties in terms of basicity and volatility, e.g., methylamine, diethylamine, trimethylamine, and the four isomeric forms of butylamine.

The base and deionized water are combined such that the resulting rinse liquid has a pH in the range of 8-10, and preferably in the range of 8.5 to 9.53. When ammonia is used as the base, it is preferably present in the rinse liquid at a concentration from $10^{-5}$ mol/L to $10^{-4}$ mol/L, which corresponds to a pH of 8.85 to 9.53.

The wafer treated in the present embodiment preferably comprises structures including a material that comprises at least one metal selected from the group consisting of cobalt, nickel, copper and platinum. The metal may be present as elemental metal, or may instead be present in the form of a compound or salt including the metal, in which case the metal could be in, for example, an ionized form. Examples of such compounds are silicides and phosphides, for example cobalt silicide, nickel-platinum silicide, cobalt tungsten phosphide, etc.

Figure 2:
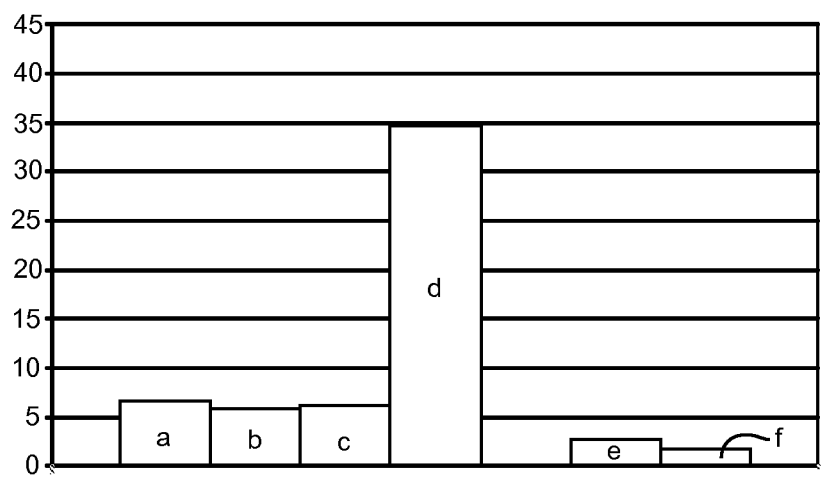
FIG. 2 is a graph showing the amount of cobalt removal for each of several rinse compositions.

Experiments were conducted to verify the suitability of dilute aqueous ammonia solutions for use as a rinse liquid on surfaces of semiconductor substrates having exposed cobalt. The results are shown in FIG. 2, wherein the units on the ordinate are Angstrom per minute of cobalt removed (i.e., etch rate). Composition "a" in FIG. 2 is ordinary deionized water as dispensed through a dedicated DI rinse arm; composition "b" in FIG. 2 is ordinary deionized water as dispensed through a multi-purpose media arm; composition "c" in FIG. 2 is degassified deionized water as dispensed through a multi-purpose media arm; composition "d" in FIG. 2 is deionized water containing dissolved $CO_2$; composition "e" in FIG. 2 is a rinse liquid according to the present invention, containing about one part ammonia to 200,000 parts DI (by volume), and composition "f" in FIG. 2 is a rinse liquid according to the present invention, containing about one part ammonia to 50,000 parts DI (by volume).

As shown in FIG. 2, compositions a-c exhibited a low etch rate on cobalt; however, as none of those compositions is conductive, they could not address the problem of static buildup that occurs during the relative movement of the dispensed rinse fluid and the wafer surface.

Composition "d" shows that conventional deionized water having dissolved carbon dioxide therein ($DICO_2$) adequately remedies static electricity build-up, but does so at the expense of a significantly higher etch rate on cobalt.

On the other hand, the compositions "e" and "f" according to the present invention not only prevent build-up of static charge, but also have a remarkably low etch rate on cobalt, which is even lower than that observed for pure non-conductive DI. The results obtained with cobalt structures are expected to apply also to the silicides of nickel and platinum, in view of their similarities in the context of the present application.

The rinse liquid according to the present invention preferably consists essentially of deionized water and a base as described above, and as such is free of intentional additives that would markedly interfere with the functions of the rinse liquid, those functions including notably the rendering of the wafer surface conductive, while having minimal etching activity on cobalt. Most preferably, the rinse liquid consists of only DI and the base as described above, with the exception of unavoidable impurities.

What is claimed is:

1. A method for treating a surface of an article, comprising:
    rotating an article on a spin chuck about a rotation axis, wherein the article comprises a surface generally perpendicular to said rotation axis that comprises structures including a material that comprises at least one metal selected from the group consisting of cobalt, nickel, copper and platinum;
    dispensing a rinse liquid onto said surface, said rinse liquid consisting essentially of an aqueous solution of a base of the formula

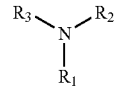

in which $R_1$, $R_2$ and $R_3$ are each independently selected from hydrogen and $C_{1-4}$ alkyl, said base having a boiling point less than 100° C., said rinse liquid having a pH in the range of 8 to 10.

2. The method according to claim 1, wherein the article is a semiconductor wafer.

3. The method according to claim 1, wherein said material is a silicide.

4. The method according to claim 1, wherein said base is a gas at 25° C. and 101.325 kPa.

5. The method according to claim 4, wherein said base is $NH_3$.

6. The method according to claim 5, wherein said $NH_3$ is present in said rinse liquid at a concentration from $10^{-5}$ mol/L to $10^{-4}$ mol/L.

7. The method according to claim 1, wherein said material is a cobalt silicide layer formed on at least one terminal of transistors formed on said surface.

8. The method according to claim 1, wherein said article is rotated at a speed of 10-2000 rpm.

9. The method according to claim 1, wherein said surface faces away from said spin chuck.

10. The method according to claim 1, further comprising continuing to rotate said article on said spin chuck after ceasing dispensing said rinse fluid.

* * * * *